United States Patent
Hou et al.

(10) Patent No.: US 6,696,708 B2
(45) Date of Patent: Feb. 24, 2004

(54) ELECTROSTATIC DISCHARGE PROTECTION APPARATUS

(75) Inventors: Chien-Ti Hou, Taipei Hsien (TW); Fu-Chien Chiu, Taipei Hsien (TW); Wei-Fan Chen, Taichung (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 10/212,604

(22) Filed: Aug. 5, 2002

(65) Prior Publication Data

US 2003/0164508 A1 Sep. 4, 2003

(30) Foreign Application Priority Data

Mar. 4, 2002 (TW) ........................ 91104196 A

(51) Int. Cl.⁷ .............................. H01L 29/74
(52) U.S. Cl. .............. 257/173; 257/175; 257/355; 257/358; 257/360; 257/363; 357/43; 357/51; 357/86; 357/13; 361/58; 361/91; 361/96; 361/98
(58) Field of Search ............... 257/173, 175, 257/355–358, 360–363; 361/58, 91, 96, 98; 357/43, 51, 86, 13, 23.13

(56) References Cited

U.S. PATENT DOCUMENTS

| 5,012,317 | A | | 4/1991 | Rountre ........................ 357/38 |
| 5,465,189 | A | | 11/1995 | Polgreen et al. .............. 361/58 |
| 6,016,002 | A | * | 1/2000 | Chen et al. ................... 257/546 |
| 6,172,404 | B1 | | 1/2001 | Chen et al. ................... 257/361 |
| 6,541,801 | B1 | * | 4/2003 | Vashchenko et al. ....... 257/119 |
| 6,542,346 | B1 | * | 4/2003 | Chen et al. ................... 361/111 |

FOREIGN PATENT DOCUMENTS

JP       10313110 A    * 11/1998

* cited by examiner

Primary Examiner—Nathan J. Flynn
Assistant Examiner—Remmon R. Fordé
(74) Attorney, Agent, or Firm—Ladas & Parry

(57) ABSTRACT

The present invention reveals an electrostatic discharge protection apparatus including a silicon controlled rectifier, a triggering voltage adapter network and a holding voltage adapter network. Additionally, the triggering voltage adapter network and the holding voltage adapter network are coupled to the silicon controlled rectifier. The present invention can change the characteristic of current vs. voltage by adjusting the triggering voltage and the holding voltage of the silicon controlled rectifier to meet the special requirement of various chips, and effectively prevent the chips from being damaged caused by the electrostatic discharging.

12 Claims, 11 Drawing Sheets

ELECTROSTATIC DISCHARGE PROTECTION APPARATUS

BACKGROUND OF THE INVENTION (A) Field of the Invention

The present invention relates to an electrostatic discharge protection apparatus. More particularly, it relates to an electrostatic discharge protection apparatus employing a silicon control rectifier.

(B) Description of Related Art

Problems of electrostatic discharge (ESD) are often encountered while in the use and manufacture of integrated circuit (IC). With scaling to down beyond 0.13 um, even 0.1 um, and the increase of demand of high-speed and wideband wireless ICs, the tiny devices within IC are easy to be destroyed by an instant electrostatic discharging. Therefore, as the IC process continuously forges ahead, highly impact of ESD to the quality of IC is becoming a crucial problem.

The international standard specification of the protection capability of current commercialized IC ESD protection contains 3 categories for regulating the endurance of ESD as from Human Body Model (HBM), Machine Model (MM) and Charged Device Model (CDM), in which the testings must be higher than 2000, 200, 1000 volts in respect of HBM, MM and CDM respectively.

As usual, ESD occurs at an instance of 10 ns to 100 ns. Therefore, an on-chip ESD protection apparatus or circuitry to prevent a chip from being damaged by ESD is extremely necessary.

An excellent ESD protection apparatus has to meet the following requirements: (1) The ESD protection apparatus is off in normal operation; and (2) Instant activation of the ESD protection apparatus once an ESD event happens.

Usually, an ESD protection apparatus is constituted of a main protection apparatus and a secondary protection apparatus. The main protection apparatus undertakes most of the amount of current when an ESD event happens, and the secondary protection apparatus is a circuitry for providing an adequate protection when the main protection apparatus is not completely activated. The main protection apparatus may be a field transistor, an NMOS transistor, a PN diode or a silicon controlled rectifier (SCR), and the secondary protection apparatus may be an MOS transistor with a gate grounded or a diode.

The SCR apparatus is the most efficient one among the aforementioned ESD protection apparatus and provides an efficient ESD protection mechanism to IC chips. When an ESD occurs, the SCR apparatus reduces its impedance instantly and is switched on to share most of the amount of current for providing a reliable and an on-chip protection. Additionally, heat generated under conduction by the SCR can be distributed evenly; therefore the device damage due to localized heat accumulation can be avoided.

The U.S. Pat. No. 5,012,317 discloses an SCR ESD protection apparatus. Referring to FIG. 1, the circuit of the SCR ESD protection apparatus 10 is connected to a bonding pad 102, and a parasitic bipolar pnp transistor 104 is coupled to a resistor 106. When the voltage between the base and emitter of a parasitic bipolar npn transistor 108, coupled to a resistor 110, is greater than a threshold voltage, the parasitic bipolar npn transistor 108 is turned on and conducts current grounding. The current flowing through the parasitic bipolar npn transistor 108 would turn on the parasitic bipolar pnp transistor 104. In return, the current flowing of the parasitic bipolar pnp transistor 104 also accelerates that of the parasitic bipolar npn 108. The kind of positive feedback current between the parasitic bipolar pnp transistor 104 and the parasitic bipolar npn transistor 108, is similar to a characteristic of a pnpn silicon controlled rectifier, which is the well-known latch-up effect. It can be applied in ESD protection apparatus to discharge the electrostatic charge of the bonding pad 102 rapidly.

The structure of the SCR ESD protection apparatus 10 is shown in FIG. 2. An N-well 202, an N+ region 204 and a P+ region 206 are formed in a P-substrate 20, and the N-well 202 contains an N+ region 208 and a P+ region 210. The N+ region 204 and P+ region 206 are grounded, and the N+ region 208 and P+ region 210 are in connection with the bonding pad 102. The pnp bipolar transistor 104 shown in FIG. 1 is constituted of the P+ region 210, the N-well 202 and the P-substrate 20, and the npn bipolar transistor 108 shown in FIG. 1 is constituted of the N+ region 204, the P-substrate 20 and the N-well 202. The base of the pnp bipolar transistor 104 is connected to the collector of the npn bipolar transistor 108, i.e. using the common N-well 202, in forming the aforementioned pnpn silicon controlled rectifier.

FIG. 3 shows a current vs. voltage (I-V) characteristic curve of the SCR ESD protection apparatus 10. The SCR ESD protection apparatus 10 is off before the latch-up occurs. When an applied voltage is higher than a "triggering voltage", the latch-up is activated to reduce the voltage to a "holding voltage" as a protection mechanism. Most of the amount of current is rapidly discharged by virtue of the pnpn structure.

Obviously, the triggering voltage and the holding voltage are two main factors relative to the characteristics of the SCR ESD protection circuit 10. (1) If the triggering voltage is too high, the device to be protected may be damaged because the SCR ESD protection apparatus 10 is not activated in time; (2) if the triggering voltage is too low, the SCR ESD protection apparatus 10 is easily activated by an exterior noise of the device; (3) if the holding voltage is too high, the device to be protected may be damaged due to heat concentration caused by the high power consumption at the high holding voltage; and (4) if the holding voltage is too low, the SCR ESD protection apparatus 10 is easily activated by an exterior noise of the protected device.

The U.S. Pat. No. 6,172,404 discloses an SCR which separates the parasitic bipolar pnp transistor 104 and the parasitic bipolar npn transistor 108 to increase the holding voltage, thereby inducing the parasitic bipolar pnp transistor 104 not turned on completely.

The U.S. Pat. No. 5,465,189 discloses a low triggering voltage SCR ESD protection circuitry, whose triggering voltage is equivalent to the breakdown voltage of the IC and normally is around 12 volts.

To sum up, the importance of the triggering voltage and holding voltage is well acknowledged, but their implementations are troublesome due to various requirements of different chips.

SUMMARY OF THE INVENTION

The object of the present invention is to provide an adjustable electrostatic discharge apparatus to prevent the device damage caused by inadequate triggering voltage and holding voltage. The electrostatic discharge apparatus employs an SCR, a triggering voltage adapter network for triggering voltage adjustment and a holding voltage adapter network for holding voltage adjustment to change the I-V characteristic of the protected device. The SCR ESD protection apparatus of the present invention provides the capability of adjustment so as to meet various requirements of different kinds of chips.

The first embodiment of an electrostatic discharge apparatus of the present invention comprises a first conductive type substrate, a gate, a triggering voltage adapter network and a holding voltage adapter network, and a holding voltage adapter network in which the substrate including a first region exhibiting a second conductive type, a second region exhibiting the first conductive type, a third region exhibiting the second conductive type, a fourth region of the first conductivity within the first region, a fifth region exhibiting the second conductive type contained in the first region and a sixth region exhibiting the second conductive type on the boundary of the first region and between the third region and the fifth region. The gate is on the surface of the substrate between the third region and the sixth region. The triggering voltage adapter network is in connection with the second region, the third region, the fourth region and the gate, and the holding voltage adapter network is in connection with the second region, the third region, the fourth region and the fifth region.

The first embodiment of an electrostatic discharge apparatus of the present invention may further comprise a seventh region of a second conductive type within the first region to be the second embodiment, in which the triggering voltage adapter network and the holding voltage adapter network are further electrically connected to the seventh region.

The third embodiment of an electrostatic discharge apparatus of the present invention comprises a substrate exhibiting a first conductive type, a gate, a triggering voltage adapter network and a holding voltage adapter network, in which the substrate including a first region exhibiting a second conductive type, a second region exhibiting the first conductive type, a third region exhibiting the second conductive type, a fourth region exhibiting the first conductive type within the first region and a fifth region exhibiting the second conductive type positioned on the boundary of the first region and between the third region and the fourth region. The triggering voltage adapter network is in connection with the second region, the third region, the fourth region and the gate. The holding voltage adapter network is in connection with the second region, the third region, the fourth region and the fifth region.

The third embodiment of an electrostatic discharge apparatus of the present invention may further comprise a sixth region of a second conductive type within the first region to be the fourth embodiment, in which the triggering voltage adapter network and the holding voltage adapter network are further electrically connected to the sixth region.

In the above embodiments, the first conductivity is P-type and the second conductivity N-type. The triggering voltage and holding voltage adapter networks are constituted of a circuit of resistor-capacitor (RC) coupling type, capacitor type or diode type.

The triggering voltage and holding voltage adapter network can be used in combination or individually to adjust the triggering voltage and holding voltage in accordance with various requirements.

DETAILED DESCRIPTION OF THE INVENTION

Figure 1:
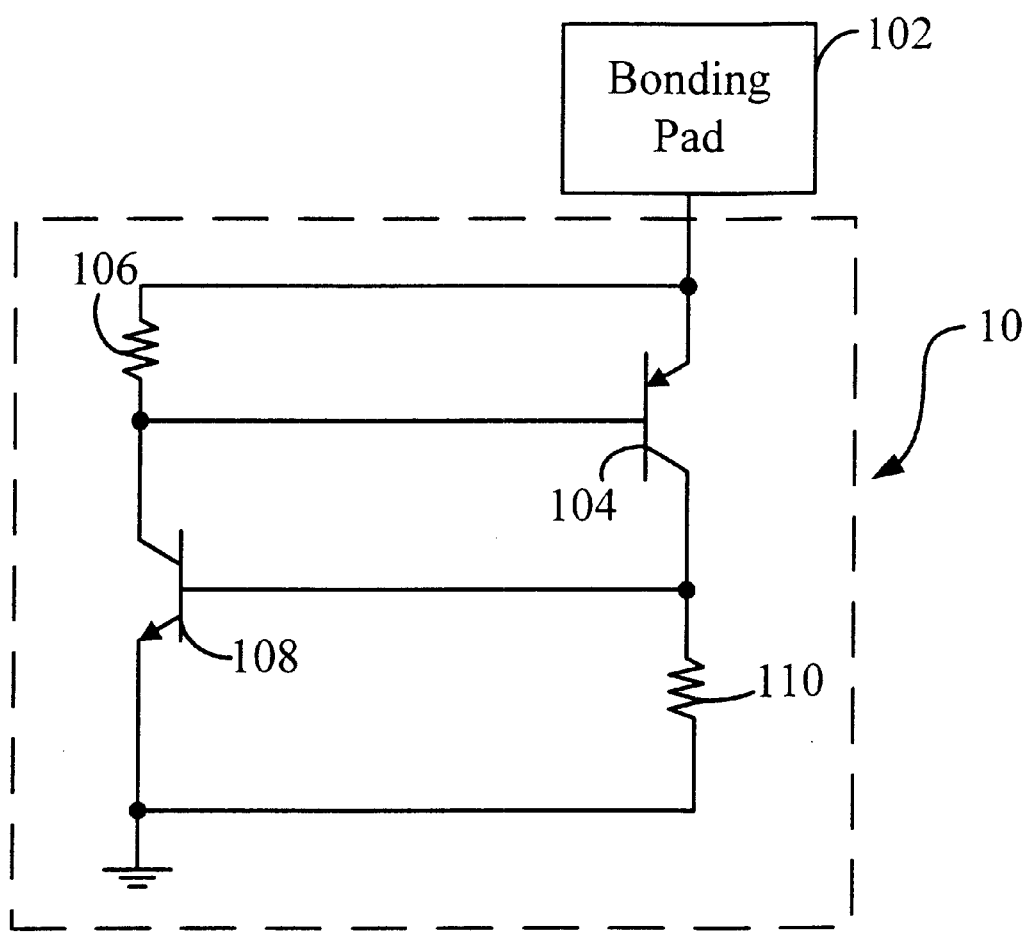
FIG. 1 is a known SCR ESD protection apparatus circuitry.
Figure 2:
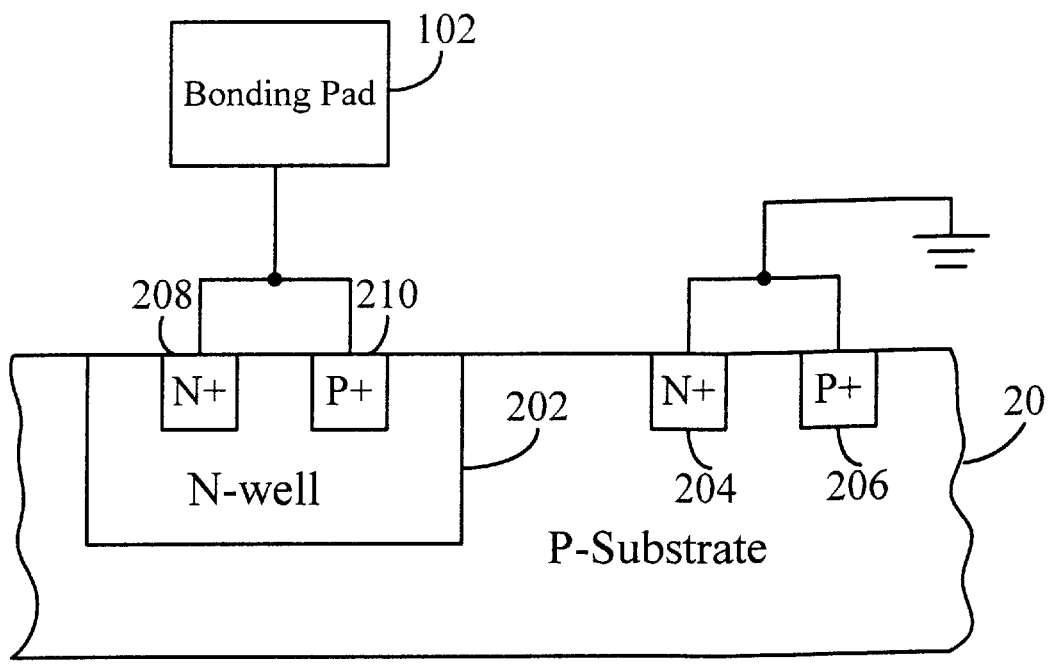
FIG. 2 is the structure of a known SCR ESD protection apparatus.
Figure 3:
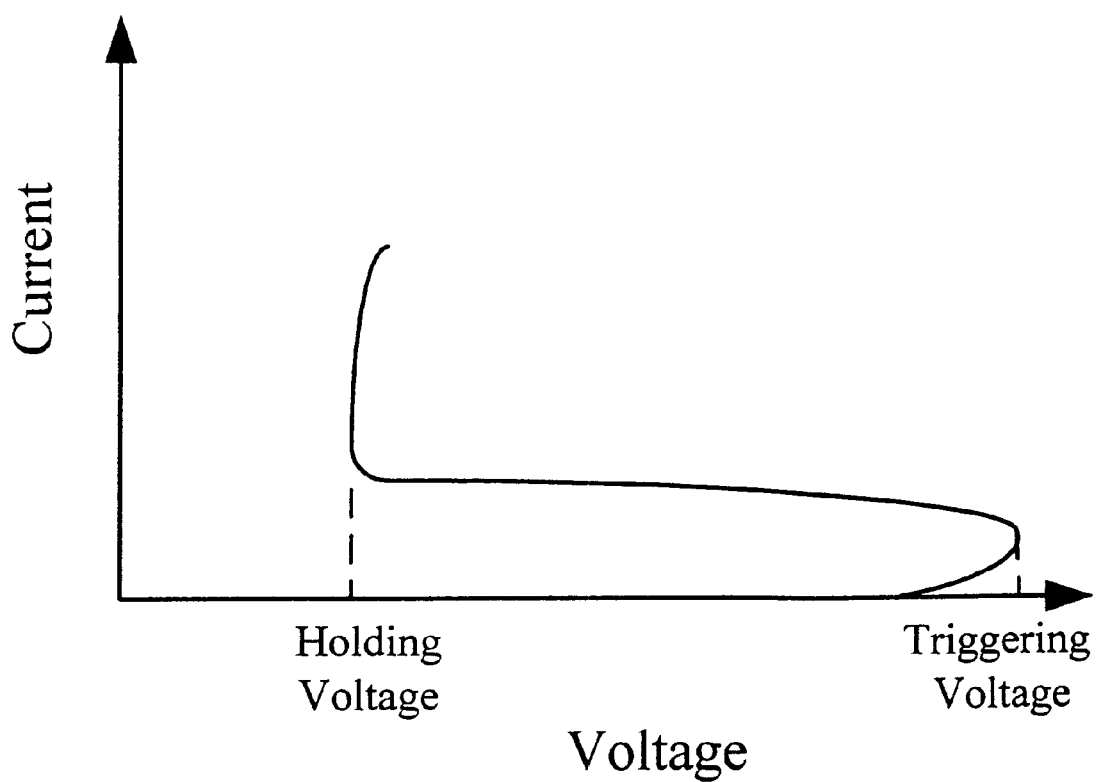
FIG. 3 is the I-V curve of a known SCR ESD protection apparatus.
Figure 4:
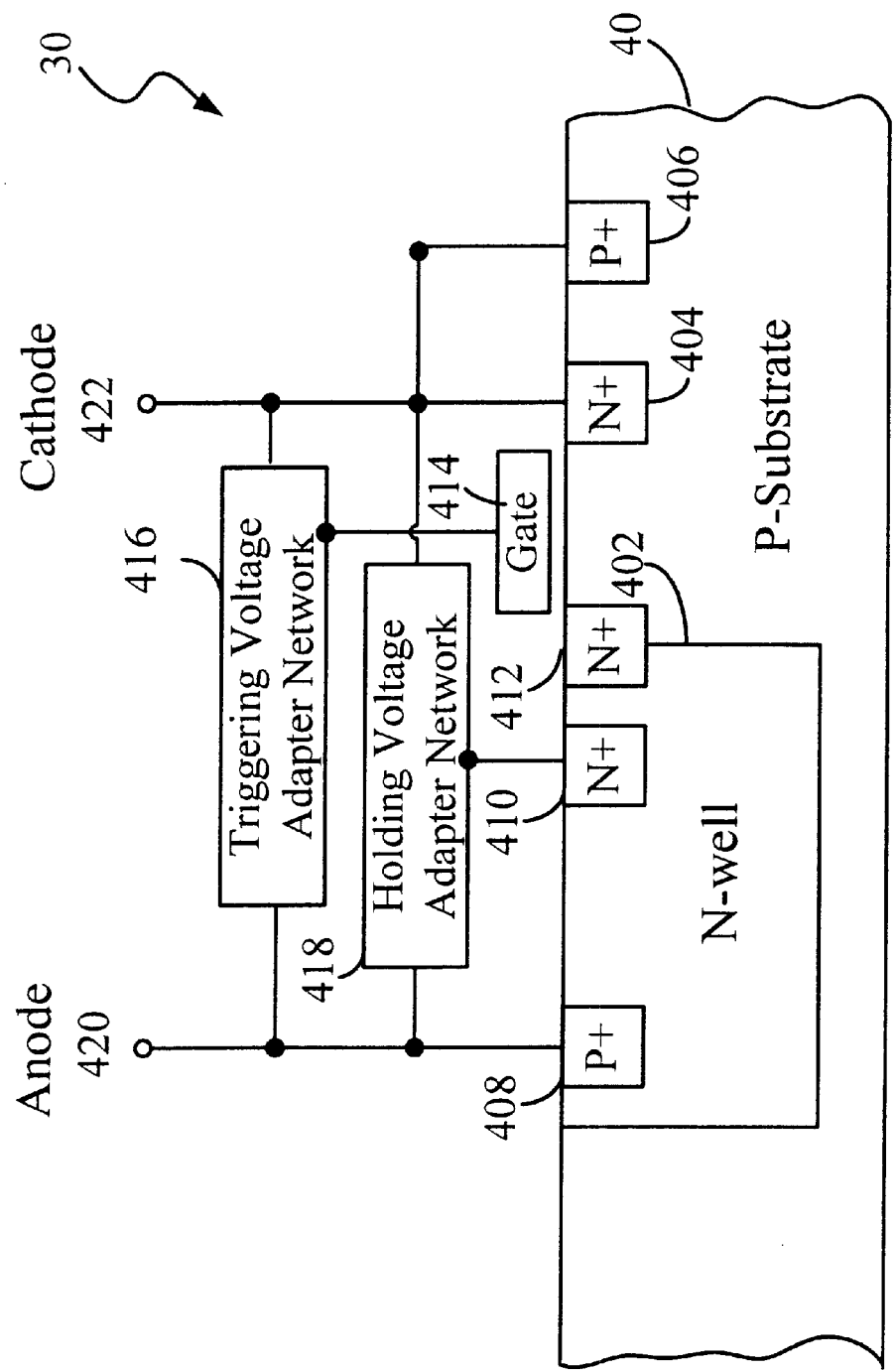
FIG. 4 to FIG. 11 show the structures of the electrostatic discharge apparatus in accordance with the present invention.

FIG. 4 illustrates a structure of the electrostatic discharge apparatus in accordance with the present invention. The electrostatic discharge apparatus 30 comprises a silicon substrate 40, a gate 414, a triggering voltage adapter network 416 and a holding voltage adapter network 418. The silicon substrate 40 of P+ type comprises an N-well 402, an N+ region 404 and a P+ region 406. The N-well 402 further comprises a P+ region 408 and an N+ region 410. In addition, an N+ region 412 is formed on the boundary of N-well 402 to provide a lower breakdown voltage of N+/P junction. The triggering voltage adapter 416 is connected to the N+ region 404, the P+ region 406, the P+ region 408 and the gate 414. The holding voltage adapter network 418 is connected to N+ region 404, P+ region 406, the N+ region 410 and the P+ region 408. The anode 420 connected to the triggering voltage adapter network 416 and the holding voltage adapter network 418 may be a bonding pad or a bus, and the cathode connected to that may be grounded. The triggering voltage adapter network 416 may be consisted of a circuit in the form of RC coupling, capacitors or diodes for NMOS transistor breakdown voltage adjustment and the triggering voltage fine-tuning. The holding voltage adapter network 418 could be formed of RC coupling, capacitors or diodes as well. The holding voltage adapter network 418 is connected to the N+ region 410, thereby adjusting the bias of the N+ region 410 will induce the carrier absorption rate within the N+ region 410. Hence, the required holding voltage of the holding voltage adapter network can be attained by adjusting the bias of the N+ region 410.

Figure 5:
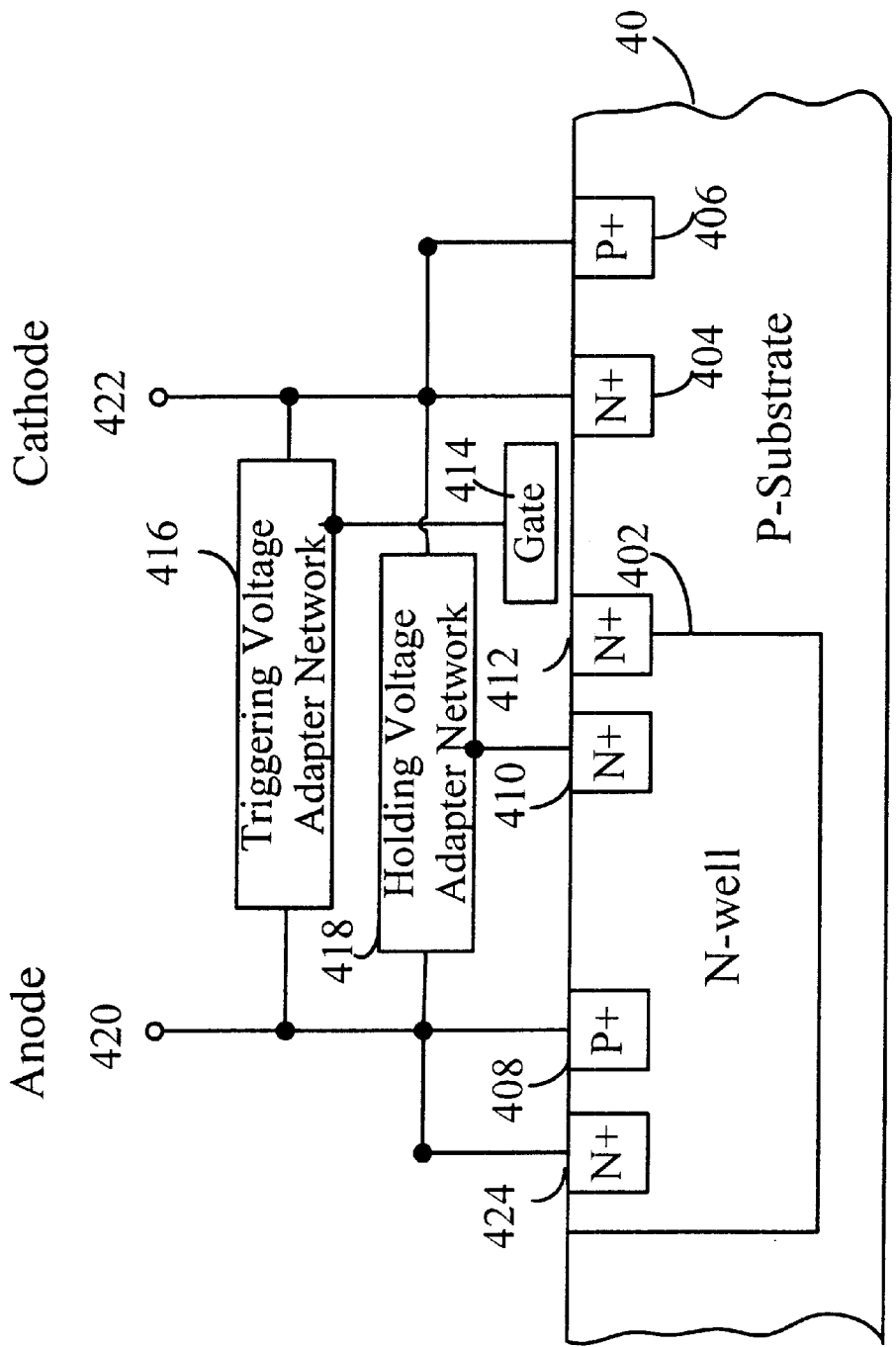

Referring to FIG. 5, instead of FIG. 4, the N-well 402 of the silicon substrate 40 further comprises an N+ region 424, and the triggering voltage adapter network 416 and holding voltage adapter 418 are all connected to the N+ region 424, i.e., a guard ring.

Figure 6:
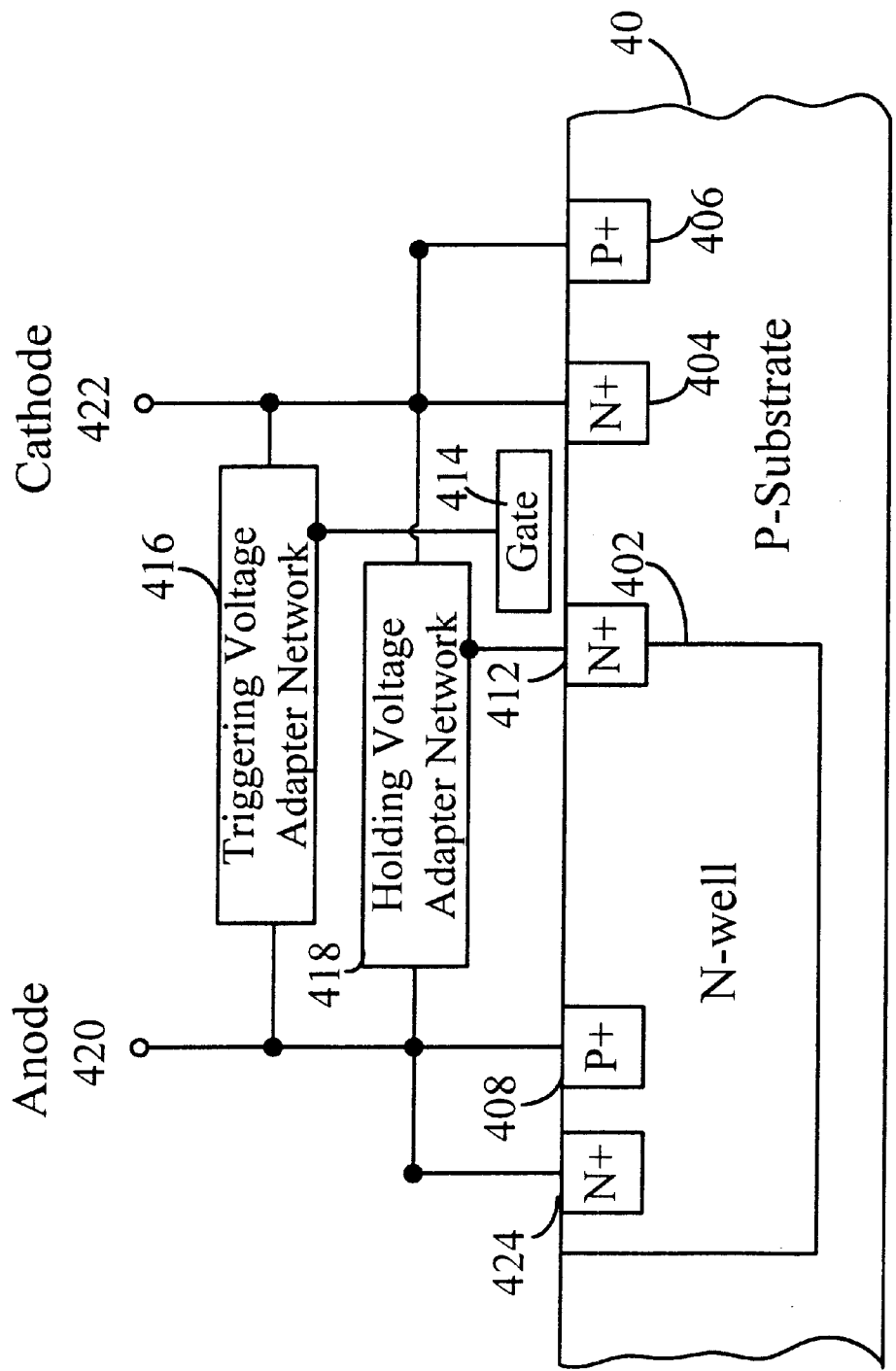

Referring to FIG. 6, N+ region 410 in FIG. 5 is removed, and the N+ region 412 is connected to the holding voltage adapter network 418. Because the holding voltage adapter network can influence the N+/P junction directly, it is capable of adjusting the triggering voltage and holding voltage simultaneously.

Figure 7:
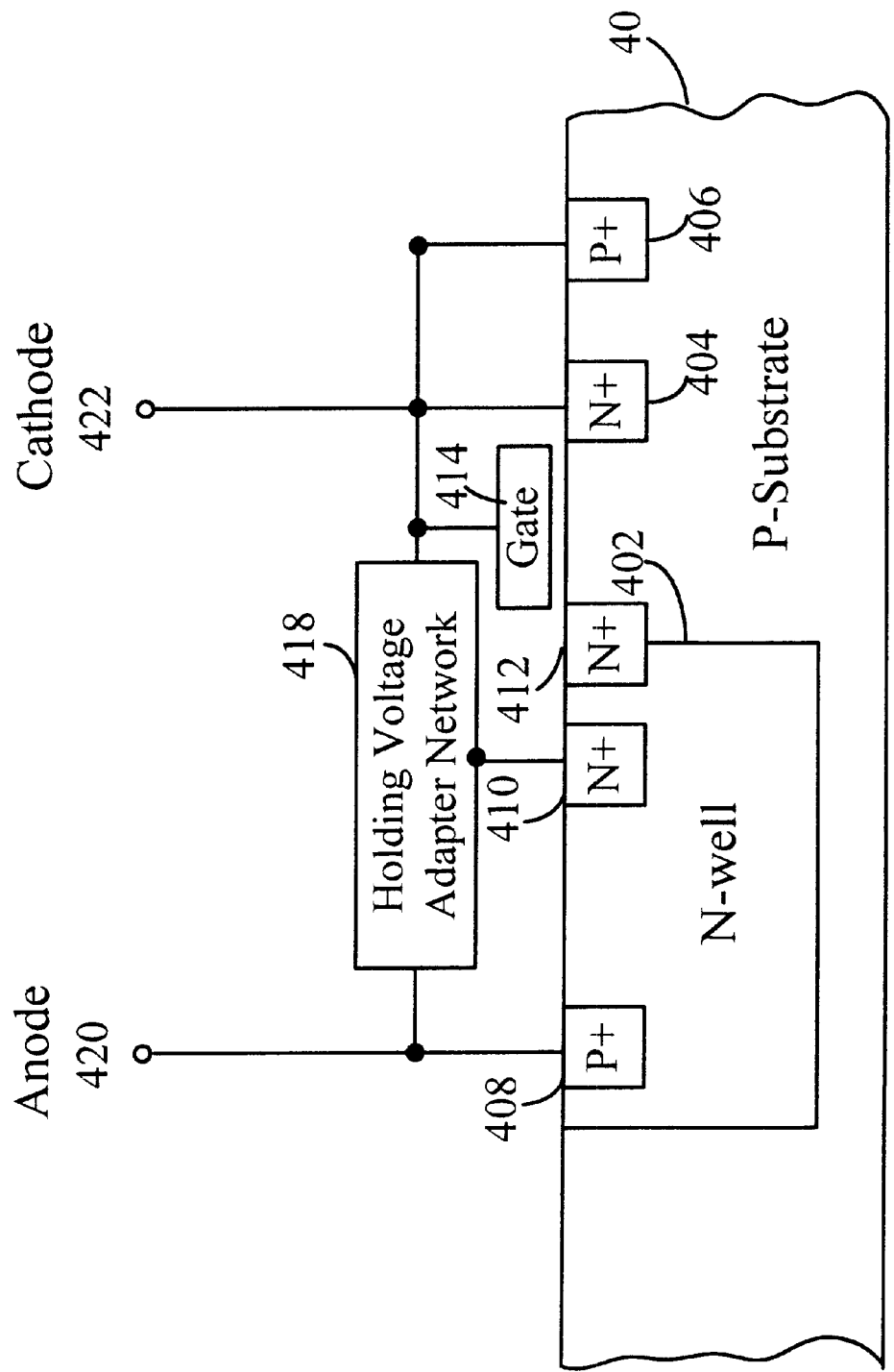

FIG. 7 shows a retrograde type of the triggering voltage adapter network in FIG. 4, in which the triggering voltage adapter network 416 is grounded, i.e., the gate 414 is connected to the grounded cathode 422.

Figure 8:
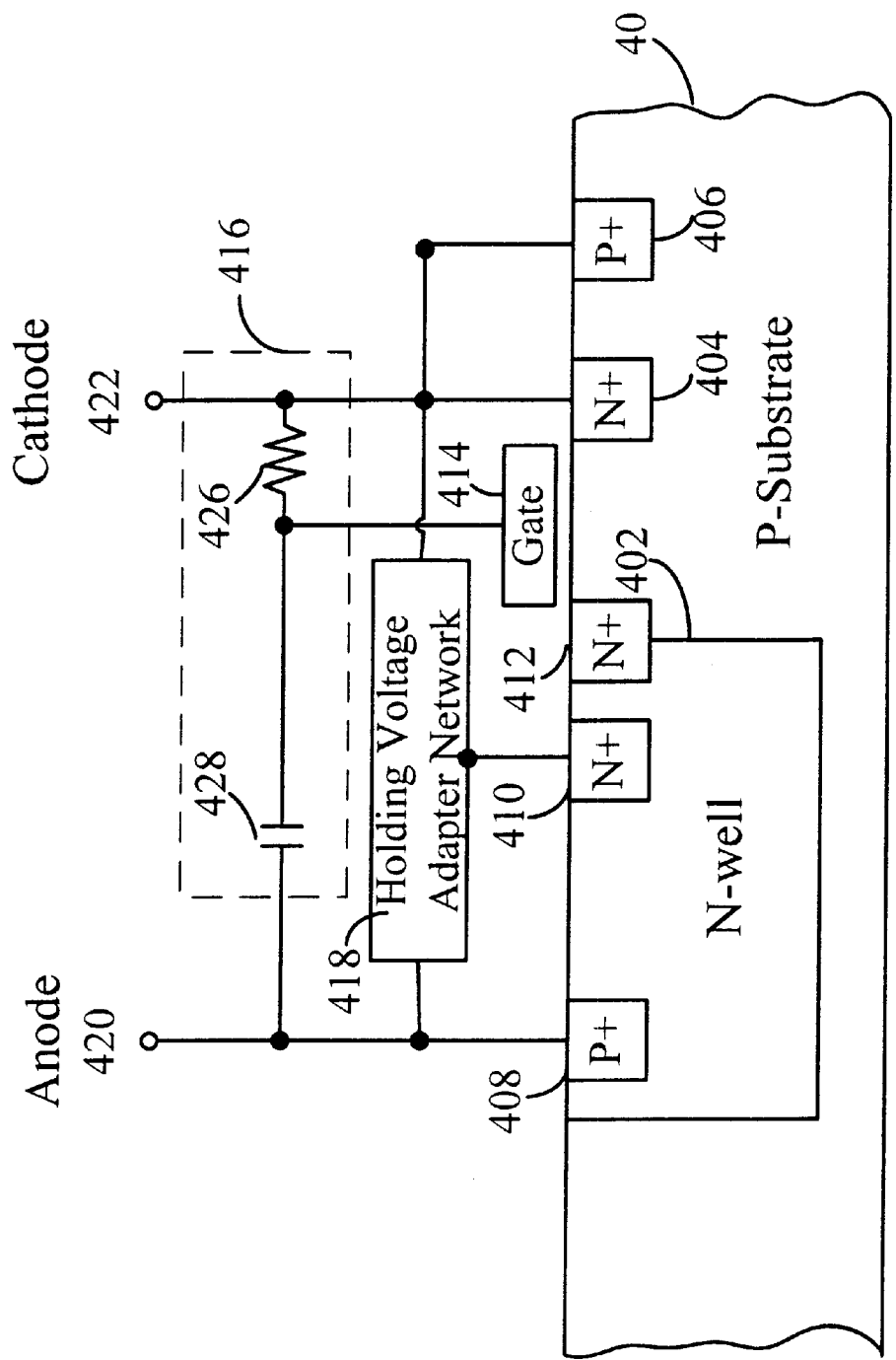

Referring to FIG. 8, the triggering voltage adapter network 416 in FIG. 4 comprises a resistor 426 and a capacitor 428. The resistor 426 and the capacitor 428 are coupled with the gate 414 for adjusting the triggering voltage.

Figure 9:
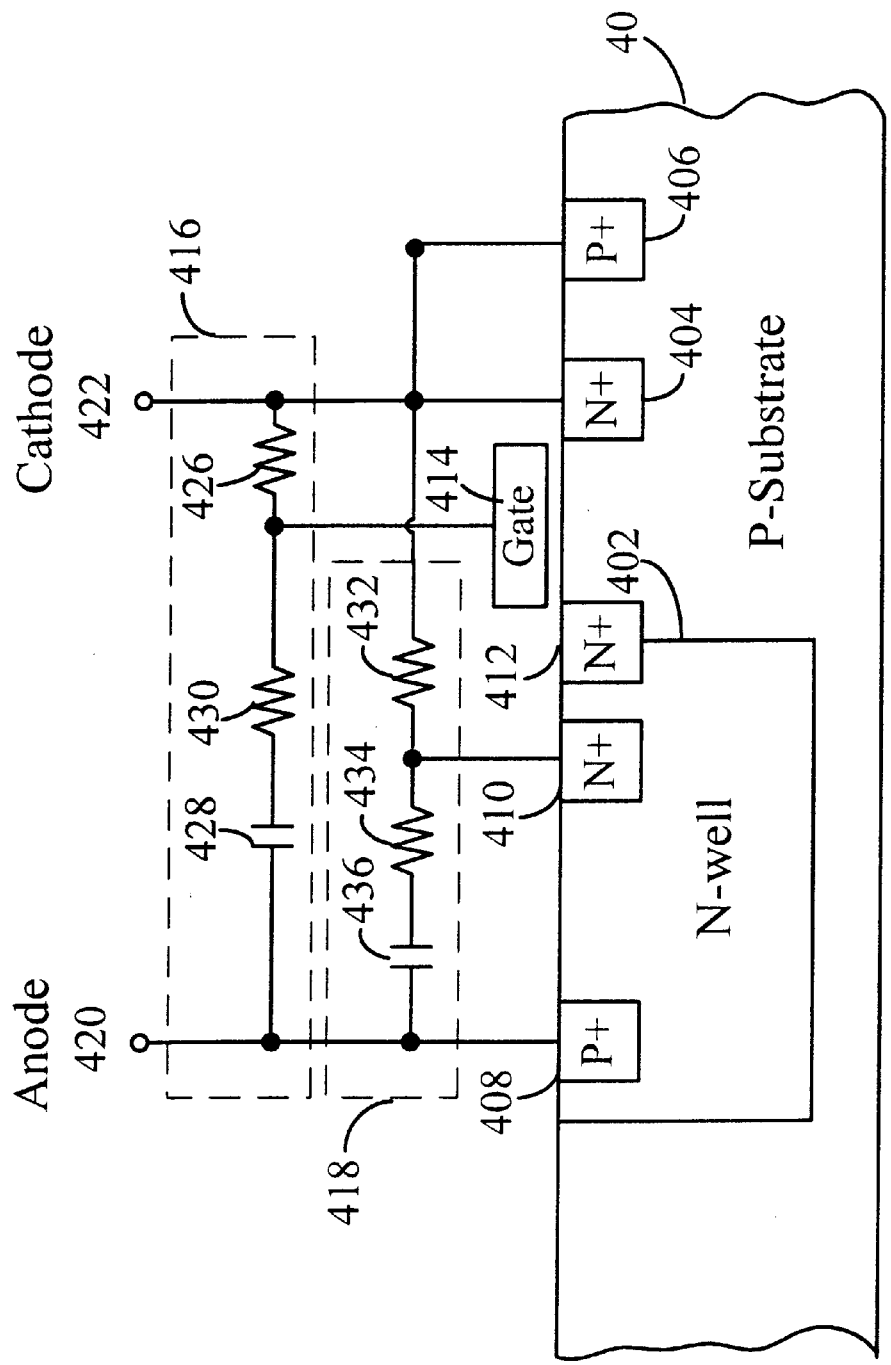

Referring to FIG. 9, the triggering voltage adapter network 416 in FIG. 4 comprises an RC coupled circuit of a capacitor 428 and a resistor 430, and a resistor 426. The holding voltage adapter network 418 comprises a RC coupled circuit of a capacitor 436 and a resistor 434, and a resistor 432. Thus, the triggering voltage and holding voltage can be adjusted by means of RC coupling. The capacitor 428 and the capacitor 436 may be composed of polysilicon or other types, and are between 0.1 pF to 1 nF, e.g., 10 pF. The resistor 430, resistor 426, resistor 434 and resistor 432 may be of the form of a N-well or other types, and are between 1000 ohms to 100 million ohms.

Figure 10:
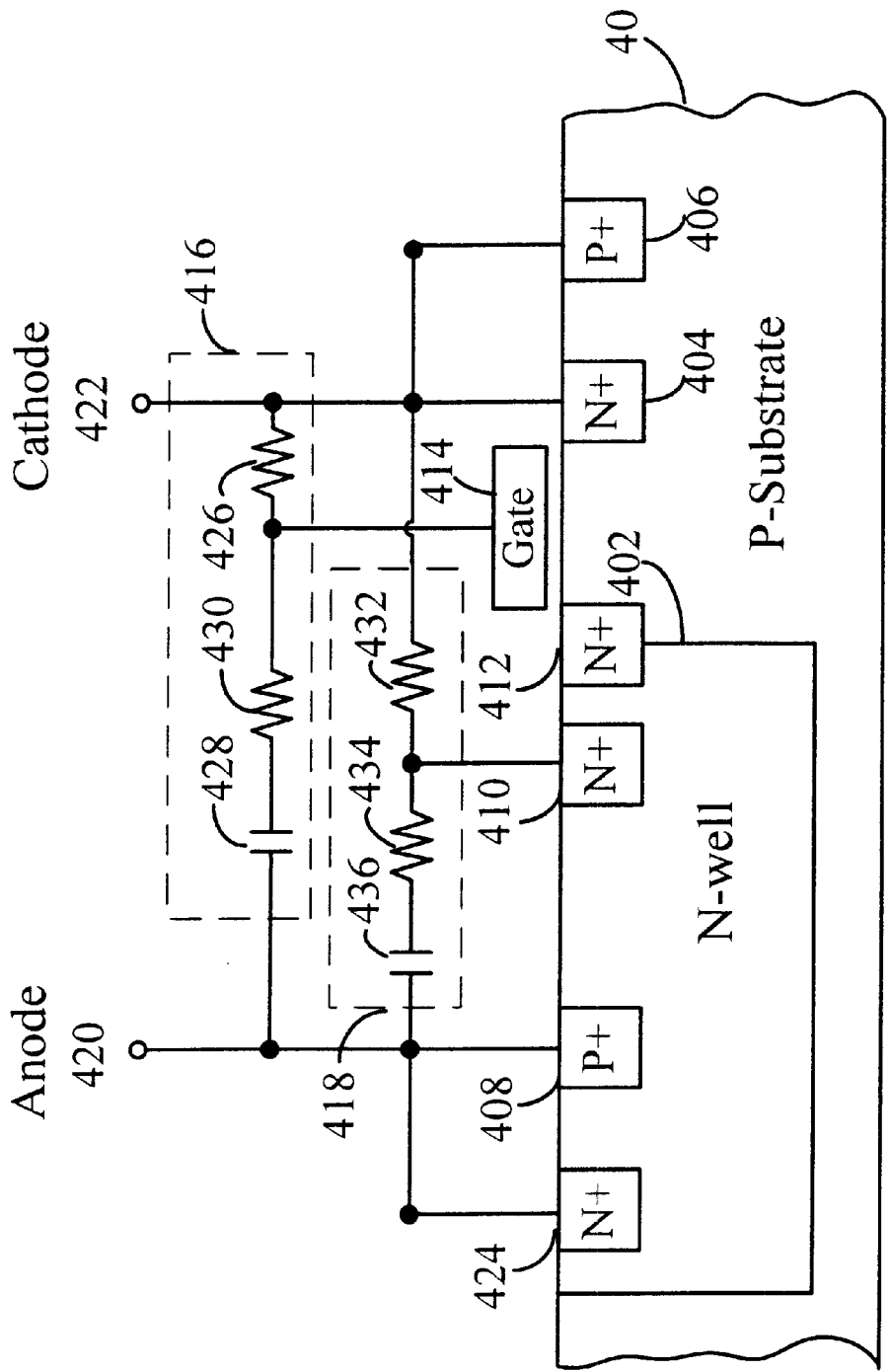

Referring to FIG. 10, the N-well 402 contained in the silicon substrate 40 in FIG. 9 further comprises an N+ region 424, and both the triggering voltage adapter network 416 and the holding voltage adapter network 418 are in connection with the N+ region 424, i.e. a guard ring. Similarly, the adjustments of the triggering voltage and the holding voltage can be performed by RC coupling as well.

Figure 11:
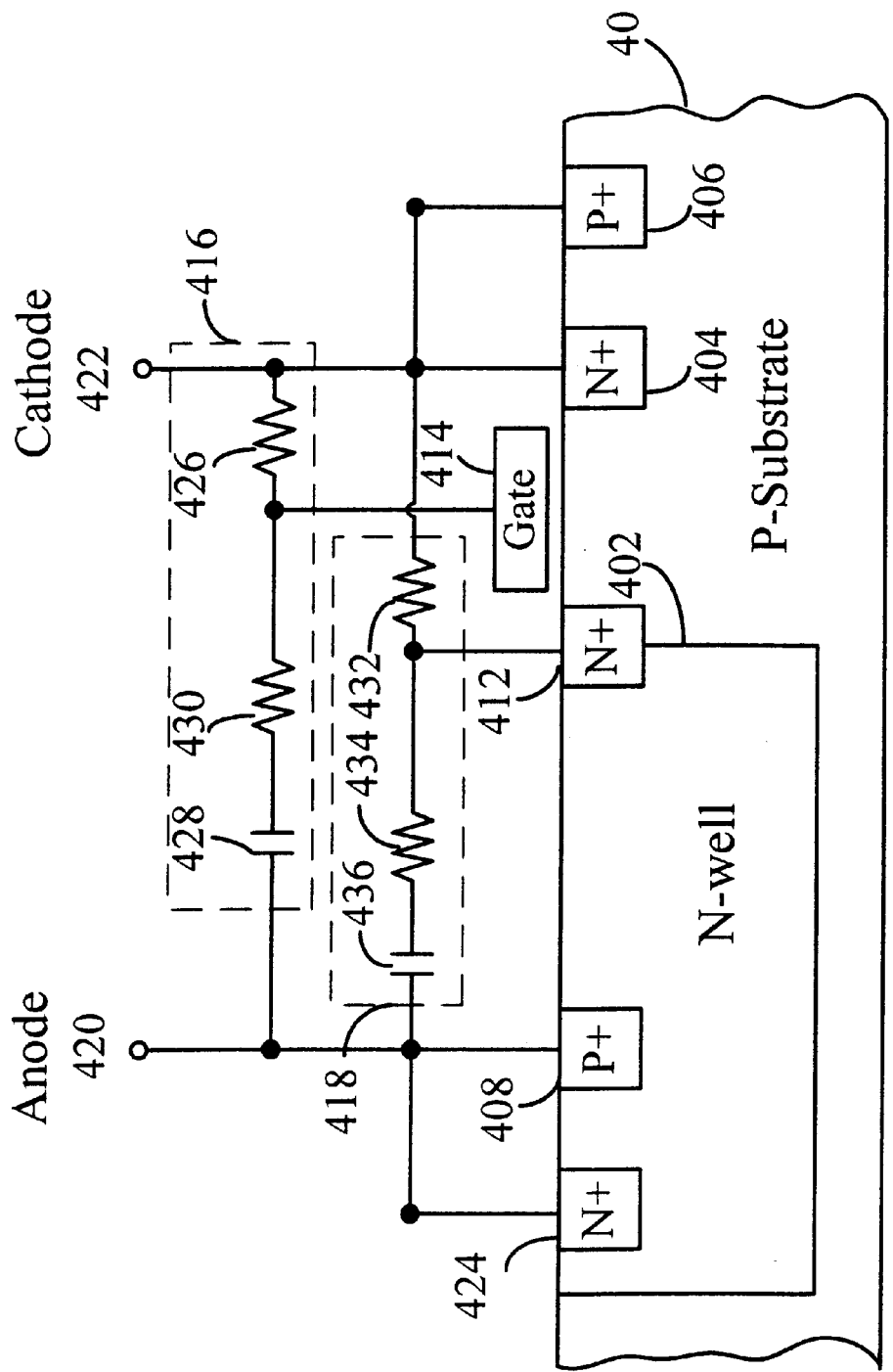

Referring to FIG. 11, removing the N+ region 410 in FIG. 10, the holding voltage adapter network 418 is connected to N+ region 412 instead in order to adjust the triggering voltage and the holding voltage simultaneously.

For statement clarity, each of the above embodiments preferably incorporates the triggering voltage adapter network and holding voltage adapter network. Actually, the triggering voltage adapter network and holding voltage adapter network can work individually for adjusting the triggering voltage and holding voltage respectively.

The above-described embodiments of the present invention are intended to be illustrative only. Numerous alternative embodiments may be devised by those skilled in the art without departing from the scope of the following claims.

What is claimed is:

1. An electrostatic discharge protection apparatus, comprising: a substrate exhibiting a first conductive type, including:
   (a) a first region exhibiting a second conductive type, having a fourth region exhibiting said first conductive type;
   (b) a second region exhibiting said first conductive type;
   (c) a third region exhibiting said second conductive type;
   (d) a fifth region exhibiting said second conductive type;
   a triggering voltage adapter network electrically connected to said second, said third and said fourth regions;
   a holding voltage adapter network electrically connected to said second, said third, said fourth and said fifth regions: and
   a gate electrically connected to said triggering voltage adapter network.

2. The electrostatic discharge protection apparatus of claim 1, wherein said fifth region is a boundary of said first region.

3. The electrostatic discharge protection apparatus of claim 1, wherein said substrate further comprises a sixth region exhibiting said second conductive type on a boundary of said first region.

4. The electrostatic discharge protection apparatus of claim 1, wherein said first conductive type is P type and said second conductive type is N type.

5. The electrostatic discharge protection apparatus of claim 1, wherein said triggering voltage adapter network comprises an RC coupled circuit.

6. The electrostatic discharge protection apparatus of claim 1, wherein said triggering voltage adapter network comprises at least one capacitor.

7. The electrostatic discharge protection apparatus of claim 1, wherein said triggering voltage adapter network comprises at least one diode.

8. The electrostatic discharge protection apparatus of claim 3, wherein said first region further comprises a seventh region exhibiting said second conductive type, and said triggering voltage adapter network and said holding voltage adapter network are electrically connected to said seventh region.

9. The electrostatic discharge protection apparatus of claim 1, wherein said holding voltage adapter network comprises an RC coupled circuit.

10. The electrostatic discharge protection apparatus of claim 1, wherein said holding voltage adapter network comprises at least one capacitor.

11. The electrostatic discharge protection apparatus of claim 2, wherein said first region further comprises a sixth region exhibiting said second conductive type, and said triggering voltage adapter network and said holding voltage adapter network are electrically connected to said sixth region.

12. The electrostatic discharge protection apparatus of claim 1, wherein said gate is grounded.

* * * * *